United States Patent [19]

Feightner

[11] Patent Number: 5,694,291

[45] Date of Patent: Dec. 2, 1997

[54] BRACKET APPARATUS FOR SECURING PERSONAL COMPUTER ADD-ON CARDS

[75] Inventor: Rick Feightner, West Linn, Oreg.

[73] Assignee: Intel Corporation, Santa Clara, Calif.

[21] Appl. No.: 743,420

[22] Filed: Nov. 1, 1996

Related U.S. Application Data

[63] Continuation of Ser. No. 497,264, Jun. 30, 1995, abandoned.

[51] Int. Cl.⁶ .................... G06F 1/16; H05K 7/12; H05K 7/14
[52] U.S. Cl. .................... 361/683; 361/686; 361/801; 361/825
[58] Field of Search .................... 364/708.1; 439/633, 439/571, 572, 377, 929, 61; 312/223.2; 361/683, 684, 686, 732, 740, 741, 747, 756, 759, 801, 802, 825

[56] References Cited

U.S. PATENT DOCUMENTS 4,971,563  11/1990  Wells, III ............................ 439/61
5,089,938  2/1992  White et al. ............................ 361/825
5,601,349  2/1997  Holts ............................ 361/801 X

FOREIGN PATENT DOCUMENTS 2608354  6/1988  France ............................ 361/801
2049509  4/1972  Germany ............................ 361/801

*Primary Examiner*—Michael W. Phillips
*Attorney, Agent, or Firm*—Blakely, Sokoloff, Taylor & Zafman

[57] ABSTRACT

A bracket apparatus having a plurality of protruding fingers is employed for simultaneously making contacts with the attachment brackets of add-on cards, exerting force on the attachment brackets towards the add-on cards' receiving expansion slots, thereby securing the add-on cards in place attached to the expansion slots. The system unit back panel is modified to include an additional cutout orthogonal to the traditional cutouts that allows the fingers to pass through and make contacts with the attachment brackets. Additionally, the bracket apparatus and the back panel further includes complementary fastening features to allow the bracket apparatus to be fastened to the back panel.

8 Claims, 6 Drawing Sheets

BRACKET APPARATUS FOR SECURING PERSONAL COMPUTER ADD-ON CARDS

This is a continuation of application No. 08/497,264, filed Jun. 30, 1995 now abandoned.

BACKGROUND OF THE INVENTION

1. Field of the Invention

The present invention relates to the field of computer systems. More specifically, the present invention relates to securing of add-on cards of personal computers.

2. Background Information

Keeping manufacturing cost low is an essential part of maintaining competitiveness in price/performance for personal computer system manufacturers. Ensuring physical as well as functional compatibility among like components supplied by different supply vendors is a critical factor in keeping manufacturing cost low. Thus, over the years, a small number of packaging form factor standards for packaging system units of personal computers have emerged as the most popular packaging form factor standards. Particular examples of these packaging form factors include "Baby AT" and "Mini Tower" etc.

Each of these packaging form factor standards specifies various physical requirements of a standard conforming personal computer system unit. In particular, the standard specifies the size of the motherboard, its orientation, i.e. horizontal or vertical. The standard further specifies where the expansion slots are to be located on the motherboard, and where the corresponding access cutouts are to be located on the back panel of the system unit.

FIG. 1 illustrates a typical prior art approach for securing add-on cards 240. Since many add-on cards 240 include connectors that have to be externalized, most typical prior art approaches involve providing a large cutout 210 to the back panel 200 of a system unit, a complementary cage structure 220, and complementary attachment brackets 244. As shown, large cutout 210 is provided at one end of back panel 200. Cage structure 220 includes a number of perimeter flanges 222. Cage structure 220 is attached to back panel 200 by welding or riveting the flanges 222 to back panel 200. In some embodiments, back panel 200 further includes a long but relatively shallow pocket 214 disposed along one side of large cutout 210. For these embodiments, one of the perimeter flange 222 is slipped into shallow pocket 214 before remaining perimeter flanges 222 are welded or riveted to back panel 200. Cage structure 220 also includes support members 224 forming cavities 226 between them for receiving attachment brackets 244 of add-on cards 240, and exposing the connectors of add-on cards 240, if any, through large cutout 210. Support members 224 and attachment brackets 244 are also provided with holes 228 and slots 248 respectively for receiving machine screws 250 to secure the add-on cards 240. While the components illustrated in FIG. 1 are "Baby-AT" components, the approach is also applicable to other "tower" form factors with the orientation of the components rotated 90 degrees.

These prior approaches all have the disadvantage of requiring the step of welding or riveting the cage structure 220 to the back panel 200. Also, each add-on card 240 has to be individually fasten at installation time, and individually loosen at removal time. Thus, it is desirable to have a more efficient approach to securing add-on cards 240 of personal computers. As will be disclosed in more details below, the present invention provides for such apparatus that achieves these and other desired results.

SUMMARY OF THE INVENTION

The desired results are advantageously achieved by providing a bracket apparatus having a plurality of protruding fingers for simultaneously pushing on the attachment brackets of the add-on cards, exerting force on the attachment brackets in a first direction towards the add-on cards' receiving expansion slots, thereby securing the add-on cards in place attached to the expansion slots. Preferably, the fingers are also curved for simultaneously pulling on the attachment brackets of the add-on cards, exerting force on the attachment brackets in a second direction towards the back panel of the system unit.

Additionally, the bracket apparatus further includes fastening features to allow the bracket apparatus to be fastened to the back panel. For some embodiments, the fastening features are designed to allow the bracket apparatus to be fastened to the outside surface of the back panel. The back panel is modified to include an additional cutout that allows the fingers to pass through and make contact with the attachment brackets. In one embodiment, the bracket apparatus is provided with fastening features on two of its sides. On one side, the bracket apparatus is provided with two slots for mating with two fingers protruding from an outer surface flange of the back panel, thereby securing that side of the bracket apparatus to the outer surface of the back panel. Preferably, the back panel's protruding fingers are also curved, exerting force on the bracket apparatus in a third direction away from the opposite side of the bracket apparatus. On the opposite side of the bracket apparatus, two holes are provided to complement another two holes provided on the back panel, to facilitate the securing of this side of the bracket apparatus to the outside surface of the back panel using machine screws.

Lastly, the additional cutout of the back panel is provided with moderate height to facilitate ease of insertion of full length add-on cards into their receiving expansion slots by allowing them to be inserted in an angular manner. At the same time, bracket apparatus is sufficiently large to ensure the entire additional cutout is adequately covered to achieve the required electromagnetic shielding for the system unit.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Figure 1:
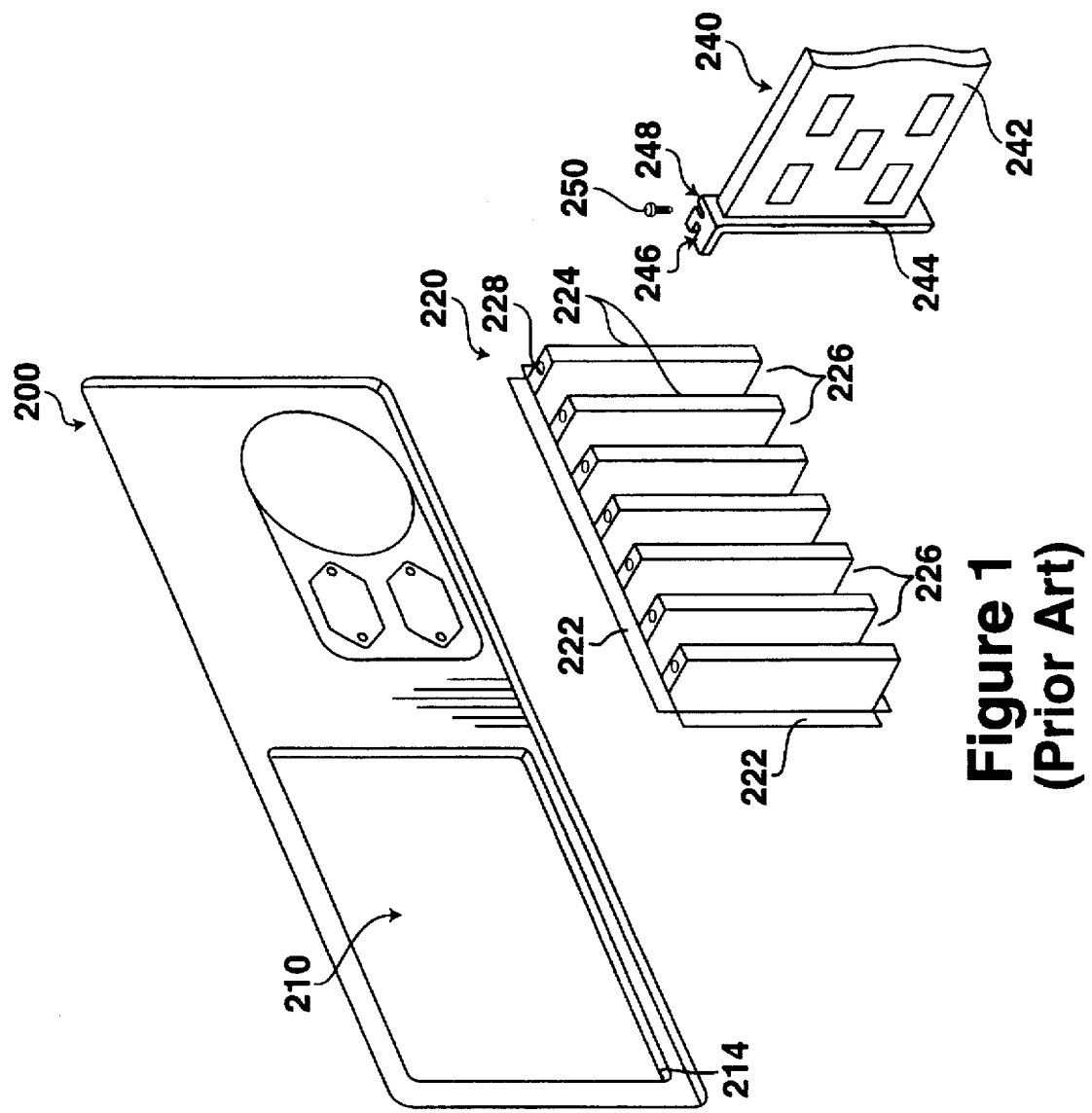
FIG. 1 illustrates a prior art approach for securing add-on cards of personal computer.
Figure 2:
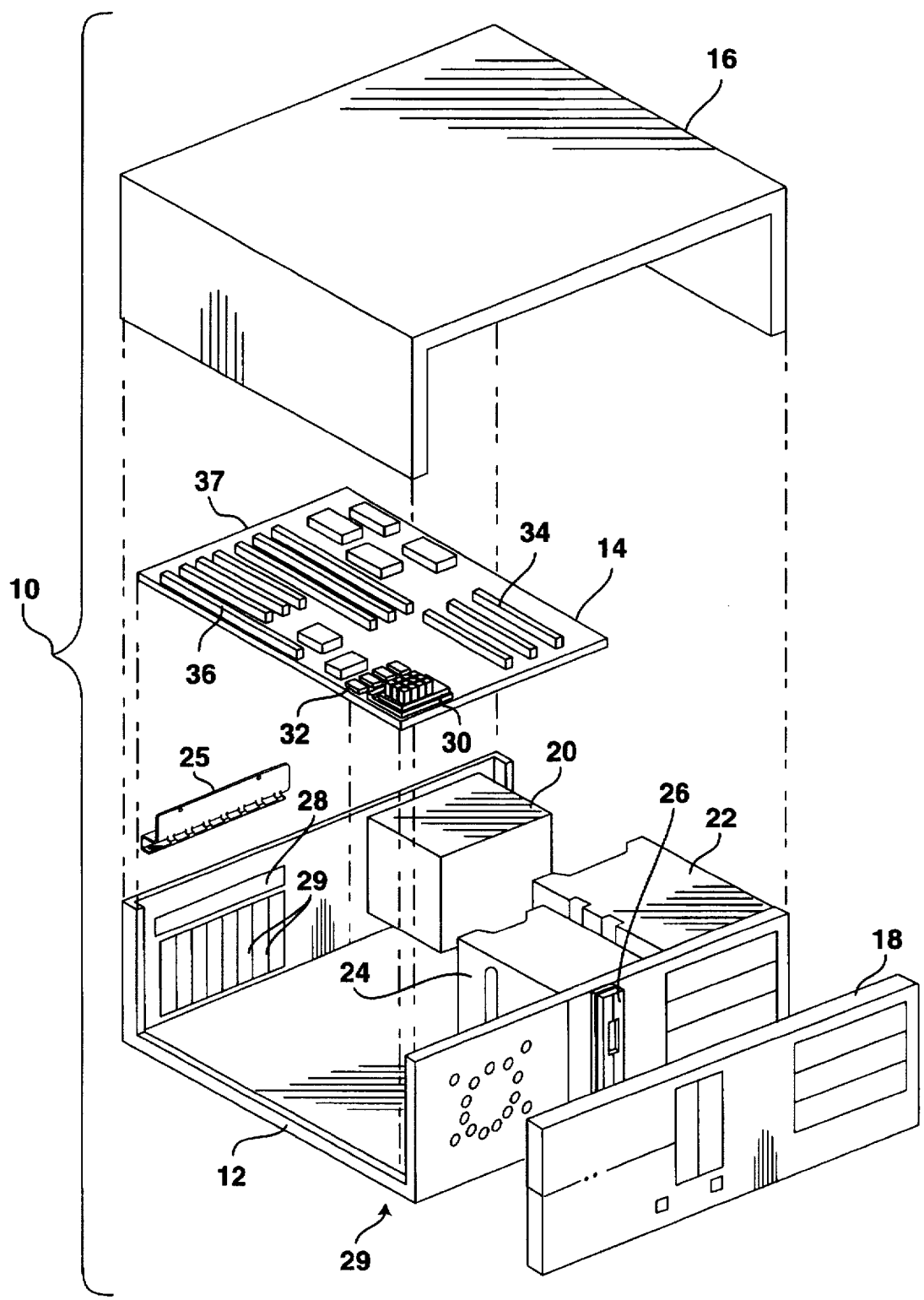
FIG. 2 illustrates a Baby-AT personal computer incorporated with the teachings of the present invention.
Figure 3A:
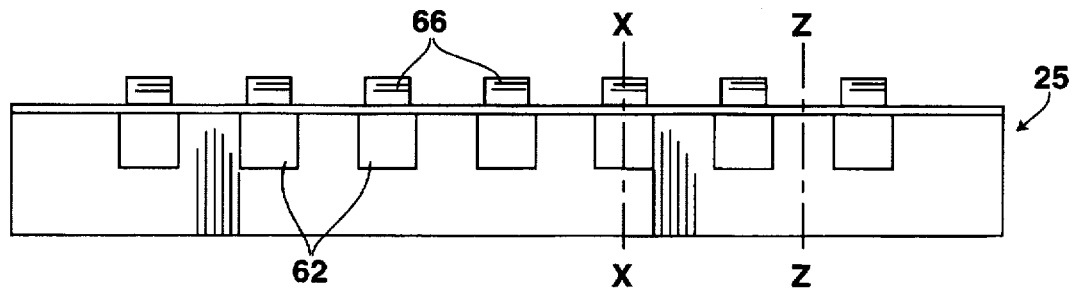
FIGS. 3a–3f are top, front, back, bottom, and side views of bracket apparatus of FIG. 2.
Figure 3B:
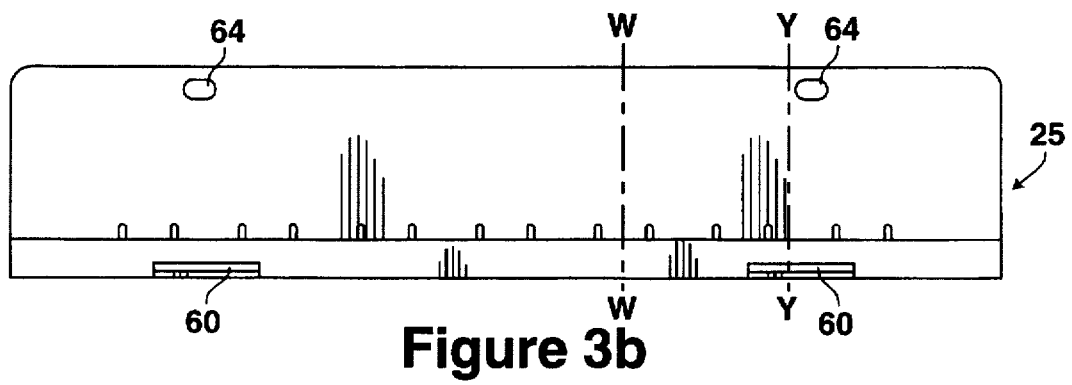
Figure 3C:
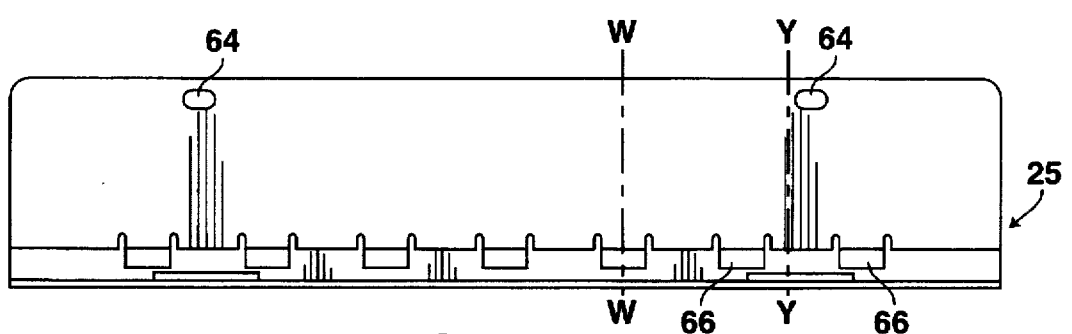
Figure 3D:
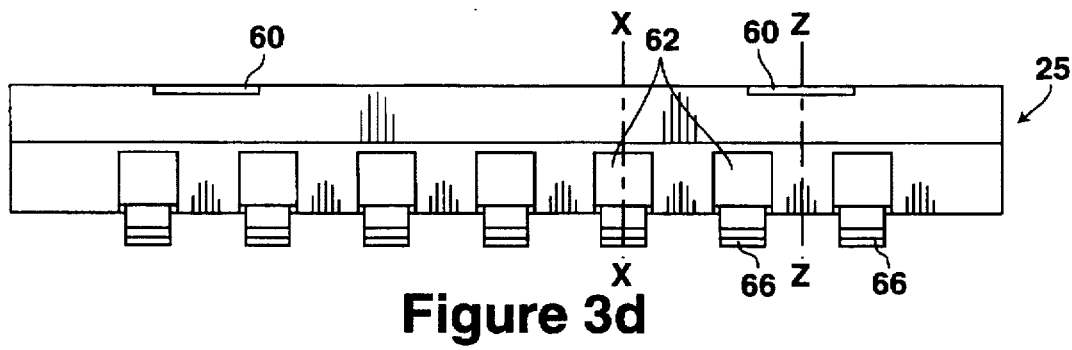
Figure 3E:
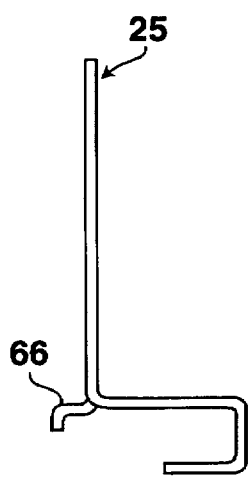
Figure 3F:
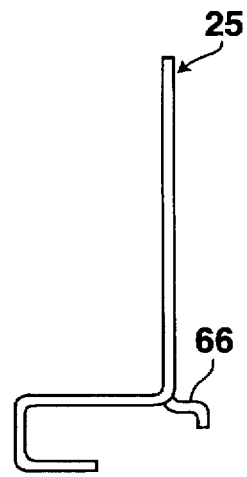

FIG. 2 illustrates an exemplary Baby-AT system unit incorporated with the teachings of the present invention. While the present invention is being described using a horizontally oriented Baby-AT system unit, based on the description to follow, it will be appreciated that the present invention may be practiced on a vertically oriented "tower" system unit also, provided the orientation of the essential features are rotated accordingly. As illustrated, exemplary Baby-AT system unit 10 comprises Baby-AT motherboard 14, hard drive 24, 3.5" drive 26, CD-ROM 22, power supply 20 and chassis 12. Baby-AT motherboard 14 includes CPU 30, cache memory 32, main memory slots 34, and expansion slots 36. Expansion slots 36 are disposed at the left rear corner of Baby-At motherboard 14 as specified by the Baby-AT form factor standard. Chassis 12 includes back panel 23 incorporated with the teachings of the present invention, and complementary bracket apparatus 25 of the present invention.

Figure 4B:
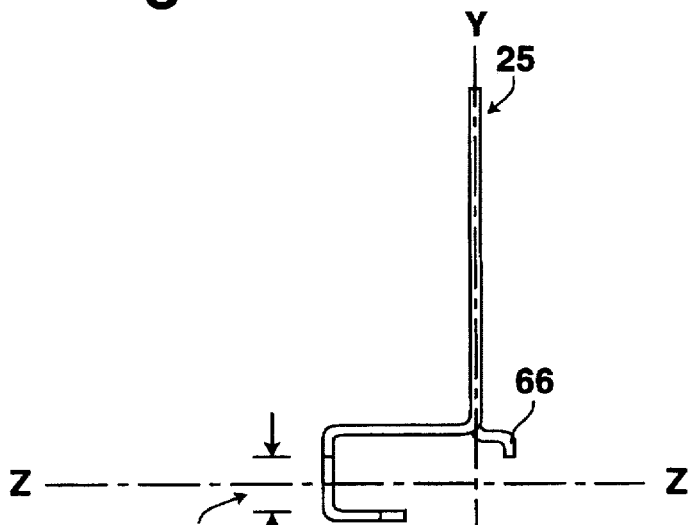
FIGS. 4a–4b are cross-sectional views of the bracket apparatus of FIG. 2.
Figure 4A:
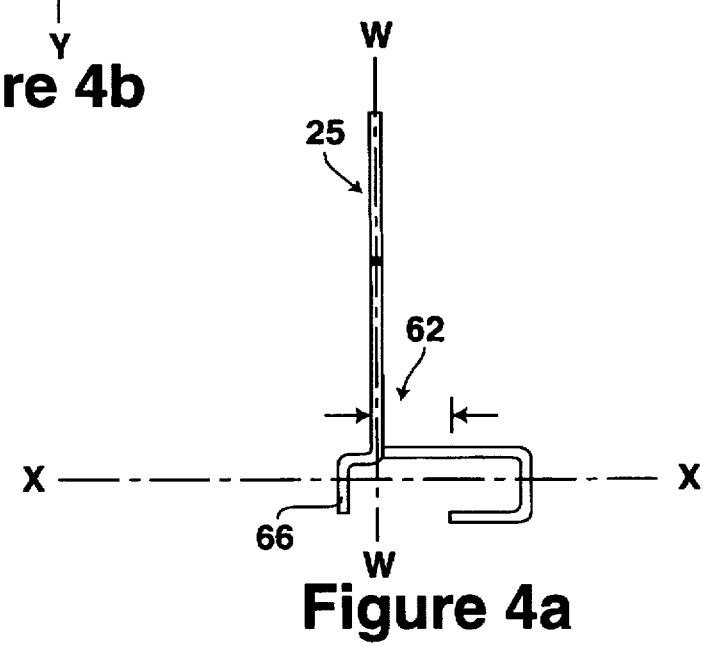

FIGS. 3a–3f and 4a–4b illustrate bracket apparatus 25 of FIG. 2 in further detail. FIGS. 3a–3f are top view, back view, front view, bottom view, and two side views of bracket apparatus 25, and FIGS. 4a–4b are cross sectional views of bracket apparatus 25 along W and X axes, and along Y and Z axes respectively. As illustrated, bracket apparatus 25 includes a plurality of protruding fingers 66 for simultaneously securing add-on cards to their respective expansion slots 36. Fingers 66 are preferably curved to allow them to exert force on the add-on cards in at least two directions. The precise manner fingers 66 secure the add-on cards will be described in more detail later. Additionally, for the illustrated embodiment, bracket apparatus 25 further includes holes 64 and slots 60 for fastening bracket apparatus 25 to back panel 23. The precise manner hole 64 and slots 60 are used to fasten bracket apparatus 25 to back panel 23 will also be described in more detail below.

Figure 5:
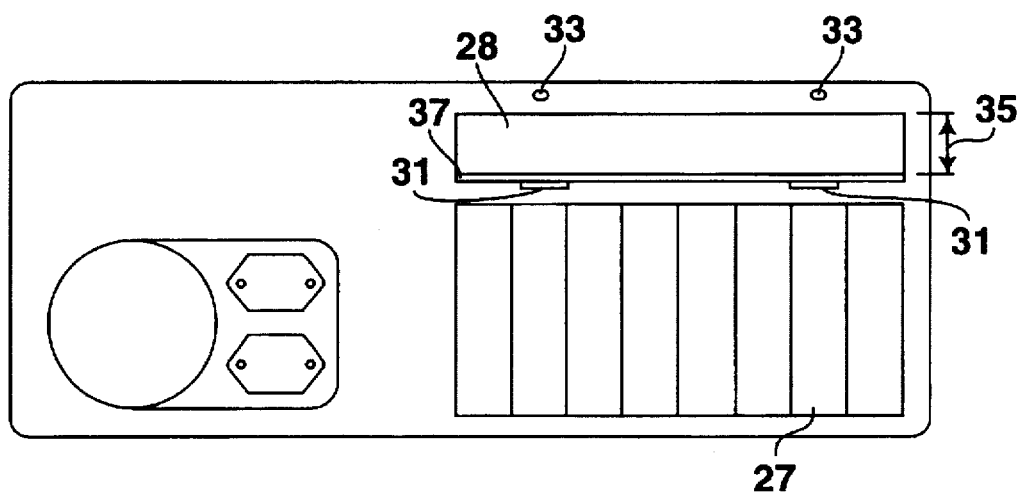
FIG. 5 illustrates modified back panel of FIG. 2 in further detail.

FIG. 5 illustrates one embodiment of modified back panel 23 in further detail. As shown, back panel 23 is provided with an additional cutout 28 for allowing protruding fingers 66 of bracket apparatus 25 to pass through to make contact with the attachment brackets of the add-on cards. Additional cutout 28 is orthogonal to the traditional cutouts 27 to allow protruding fingers 66 to simultaneously contact the attachment brackets of all add-on cards at the same time. Additionally, for the illustrated embodiment, back panel 23 is further provided with complementary holes 33 and a flange 37 with fingers 31 for fastening bracket apparatus 25 to the outer surface of back panel 23. Preferably, fingers 31 are also curved to allow them to exert force on one side of bracket apparatus 25.

Figure 6B:
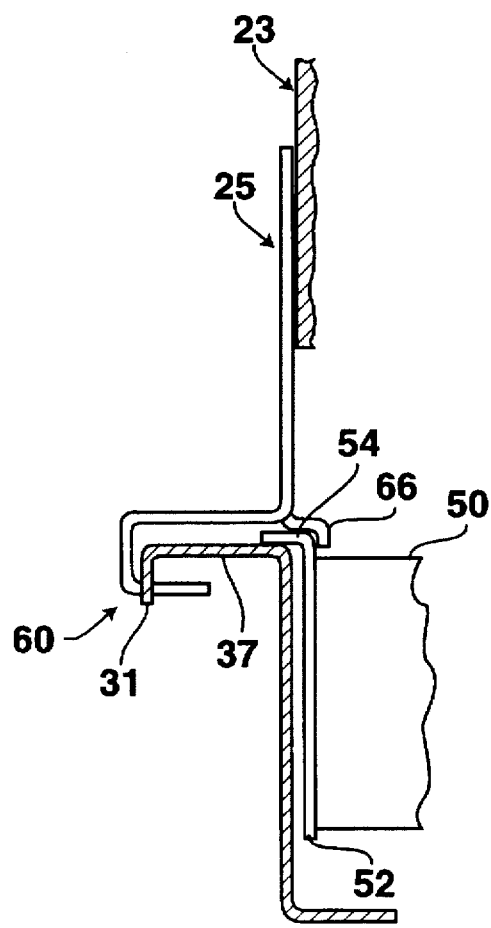
FIG. 6a–6b are exploded perspective and cross-sectional views illustrating the manner in which the bracket apparatus of the present invention, the modified back panel, and the attachment bracket of an add-on card cooperate with each other.
Figure 6A:
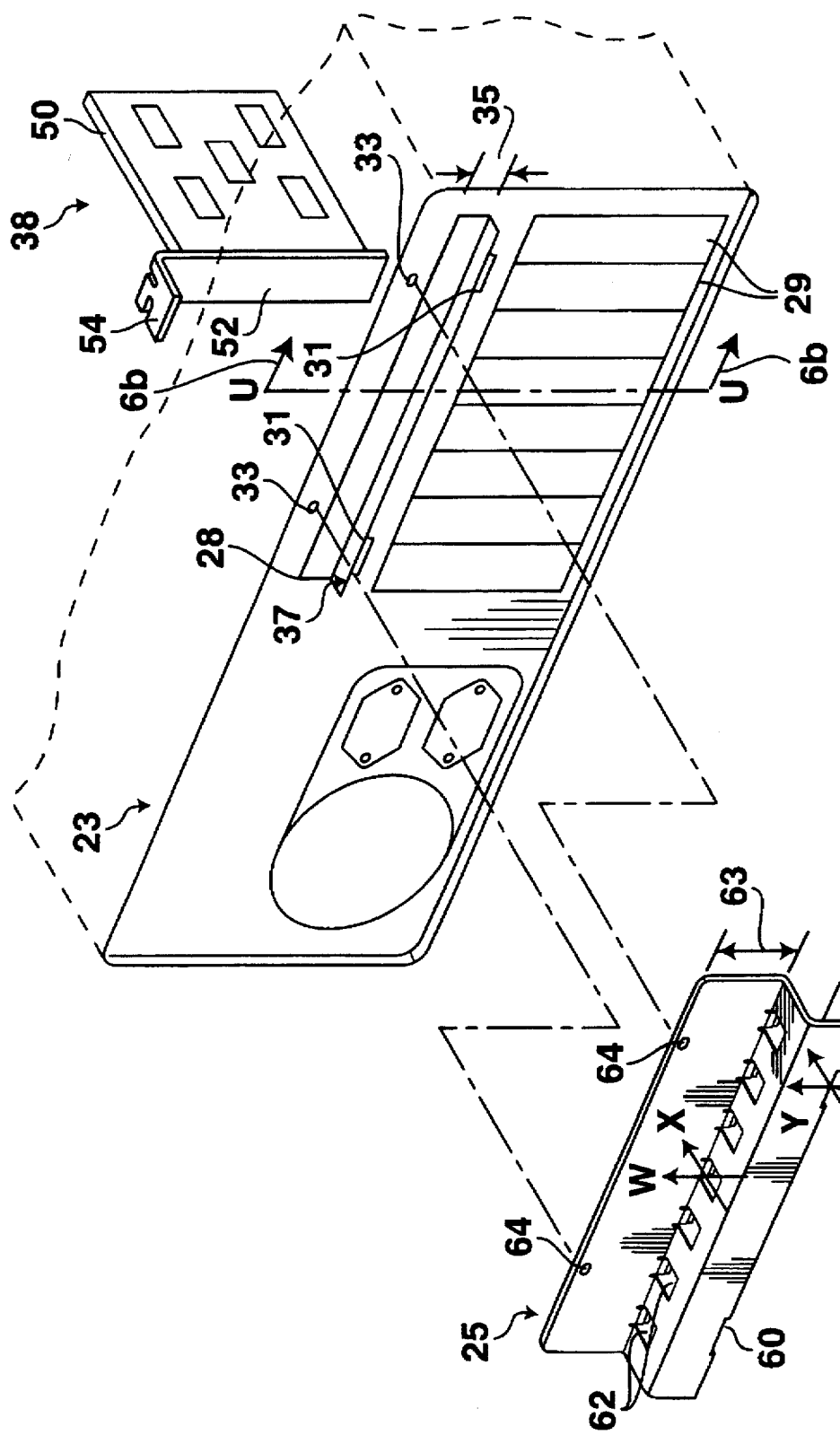

Referring now to FIGS. 6a–6b, wherein the manner in which bracket apparatus 25, modified back panel 23 and attachment bracket, 52 cooperate with each other is shown. FIG. 6a is an exploded perspective view-whereas FIG. 6b is a cross sectional view along line 6b—6b in FIG. 6a. As illustrated, protruding fingers 66 of bracket apparatus 25 pass through additional cutout 28 of back panel 23 at an angle until slots 60 are engaged by fingers 31, whereupon apparatus 25 is rotated towards back panel 23 in an upward fashion until protruding fingers 66 simultaneously make contact with attachment brackets 54 of add-on cards 50. As described earlier, fingers 66 are preferably curved, thereby allowing fingers 66 to exert force on add-on cards 50 in a first direction towards their receiving expansion slots 36 and in a second direction towards modified back panel 23; as a result simultaneously securing all add-on cards 50 to their respective expansion slots 36 at the same time.

Fingers 31 mate with complementary slots 60 to attach the "bottom" side of bracket apparatus 25 to back panel 23. On the other side, i.e. the "top" side, complementary holes 64 and 33 allow the "top" side of bracket apparatus 25 to be attached to back panel 23 using machine screws. As depicted in FIG. 6a and 6b, once fingers 31 have engaged complementary slots 60 to attach the bottom side of bracket apparatus 25, bracket apparatus 25 is rotated in an upward fashion facilitating the alignment of complementary holes 64 and 32, thus securing bracket apparatus 25 to system unit back panel 23.

Furthermore, additional cutout 28 of back panel 23 is preferably provided with moderate height 35 to facilitate ease of insertion of full length add-on cards 50 into their receiving expansion slots 36 by allowing add-on cards 50 to be inserted in an angular manner. At the same time, bracket apparatus 25 is sufficiently "tall" to ensure the entire additional cutout 28 is adequately covered to achieve the required electromagnetic shielding for the system unit.

Thus, a bracket apparatus 25 and its complementary arrangements for securing add-on cards 50 of personal computers has been described. As will be appreciated by those skilled in the art, bracket apparatus 25 and its complementary arrangements of the present invention eliminate the need for the cage structure, thereby reducing the number of system unit manufacturing steps and accordingly manufacturing cost. Finally, while the bracket apparatus 25 of the present invention has been described in terms of the above illustrated embodiment, those skilled in the art will recognize that the invention is not limited to the embodiment described. The present invention can be practiced with modification and alteration within the spirit and scope of the appended claims. The description is thus to be regarded as illustrative instead of restrictive on the present invention.

What is claimed is:

1. A bracket apparatus for securing a plurality of add-on cards having a like plurality of attachment brackets, to a corresponding plurality of receiving expansion slots of a computer, the bracket apparatus having:

a plurality of protruding fingers, disposed along a first side of a bottom end of the bracket apparatus, for engaging the plurality of attachment brackets simultaneously, exerting a first force on the plurality of attachment brackets in a first direction towards the receiving expansion slots; and a plurality of fastening features for securing the bracket apparatus to an outer surface of a system unit back panel of the computer, including a longitudinal fastening feature disposed along a second side of the bottom end of the bracket apparatus, the longitudinal fastening feature having a plurality of slots designed to engage a complementary plurality of protruding fastening features disposed on the system unit back panel, the complementary plurality of protruding fastening features asserting a second force on the plurality of slots of the longitudinal fastening feature in a second direction counter to the first direction.

2. The bracket apparatus of claim 1, wherein the plurality of protruding fingers are curved allowing the plurality of protruding fingers to exert the second force on the plurality of attachment brackets in the second direction towards the system unit back panel of the computer.

3. The bracket apparatus of claim 1, further comprising a second fastening feature including a plurality of holes, disposed along the top end of the bracket apparatus, that are complementary to a plurality of holes provided on the outer surface of the system unit back panel, facilitating the attachment of the top end of the bracket apparatus to the outer surface of the system unit back panel with screws.

4. A system unit chassis of a personal computer comprising a) a back panel having a first plurality of cutouts for externalizing connectors of a corresponding plurality of add-on cards, having a like plurality of attachment brackets, and a second cutout for facilitating securing of the plurality of add-on cards, the second cutout being disposed in an orthogonal orientation alongside the first plurality of cutouts; and b) a bracket apparatus having a plurality of protruding fingers making simultaneous contact with the plurality attachment brackets of the plurality of add-on cards, exerting a first force on the attachment brackets in a first direction towards a plurality of receiving expansion slots securing the plurality of add-on cards to the corresponding plurality of receiving expansion slots.

5. The system unit chassis of claim 4, wherein the plurality of protruding fingers are curved, allowing the plurality of protruding fingers to exert a second force on the plurality of attachment brackets in a second direction towards the back panel securing the plurality of add-on cards to the back panel of the system unit chassis.

6. The system unit chassis of claim 4, wherein the back panel and the bracket apparatus further includes a complementary plurality of fastening features fastening the bracket apparatus to the back panel.

7. The system unit of claim 6, wherein the complementary plurality of fastening features include slots disposed at a first side of the bracket apparatus, and an outer surface flange with protruding flange fingers on the back panel attaching the first side of the bracket apparatus to the outer surface of the back panel by mating the protruding flange fingers with the slots of the bracket apparatus.

8. The system unit chassis of claim 4, wherein the plurality of fastening features include a plurality of first holes disposed at a first side of the bracket apparatus, and a complementary plurality of second holes disposed on an outer surface of the back panel facilitating attachment of the first side of the bracket apparatus to the outer surface of the back panel using machine screws.

* * * * *